United States Patent
Petrovic

(10) Patent No.: US 7,075,389 B1
(45) Date of Patent: Jul. 11, 2006

(54) METHOD AND APPARATUS FOR ACHIEVING BROADBAND MATCHING OF NARROW-BAND RESONATOR FILTER IMPEDANCES TO LOADS AND SOURCES

(75) Inventor: Branislav Petrovic, La Jolla, CA (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/580,504

(22) Filed: May 25, 2000

(51) Int. Cl.
*H03H 7/06* (2006.01)
*H03H 7/38* (2006.01)

(52) U.S. Cl. ..................... 333/175; 333/176
(58) Field of Classification Search ............... 333/175, 333/176
See application file for complete search history.

(56) References Cited

U.S. PATENT DOCUMENTS 4,748,667 A * 5/1988 Farmer et al. ............. 380/208

FOREIGN PATENT DOCUMENTS

WO    WO 01/91292 A2 * 11/2001

* cited by examiner

*Primary Examiner*—Dean Takaoka
(74) *Attorney, Agent, or Firm*—Nath & Associates PLLC; Gregory B. Kang; Stanley N. Protigal

(57) ABSTRACT

A circuit for matching the impedance of a narrow-band resonator filter presented to a port over a broad range of frequencies employs a second resonator that has substantially the same transfer characteristic as the resonator filter. The resonator filter is isolated from the output port using a resonator having a dual characteristic that behaves as a short circuit in the pass-band of the resonator filter, and is an open circuit in the stop-band of the resonator filter. The second resonator is isolated from the port using a resistor that has a value on the order of the ideal or desired impedance to be presented at the port. The circuit provides an impedance at the port that is approximately equal to the desired impedance in the stop-band, and an impedance that is slightly degraded in the pass-band, and particularly at the on-frequency of the resonator filter. The circuit is particularly useful when narrow band-pass resonator filters are employed in broadband multichannel systems coupled to the input ports of an impedance sensitive load, such as a passive mixers used to perform frequency conversion over a wide range of frequencies.

4 Claims, 8 Drawing Sheets

METHOD AND APPARATUS FOR ACHIEVING BROADBAND MATCHING OF NARROW-BAND RESONATOR FILTER IMPEDANCES TO LOADS AND SOURCES

BACKGROUND OF THE INVENTION

1. Field of the Invention

This invention relates to matching the impedance presented by a narrow-band resonator filter to typical load and source impedances over a wide frequency range, and with particular application to broadband systems in which narrow-band filters internal to the system are required to provide matched impedances over the broadband frequency range of the system.

2. Background of the Related Art

A filter circuit typically presents an impedance that varies over frequency, with the impedance of the filter reaching an ideal or characteristic impedance in its pass-band. A band-pass circuit reaches its characteristic impedance at its "on-frequency" ($f_c$) in the pass-band, and presents drastically higher or lower impedance in the stop-band. FIG. 1a illustrates the transfer characteristic 10 of a band-pass filter and its $f_c$ 12. FIG. 1b illustrates the impedance characteristics 14,16 presented by dual band-pass filter structures over the same frequency range, reaching an ideal impedance $Z_O$ 18 at $f_c$ 12. FIGS. 2a and 2b both present low-pass filters that are duals of each other and their respective impedance characteristics reflect their dual nature. A topology that is a dual of another topology produces the same output transfer characteristic but typically one is a parallel structure whereas the other is a series structure. Complementary structures have output characteristics that are the inverse of one another.

FIG. 3a illustrates the well-known principle that maximum power is transferred to a load when the load impedance $Z_L$ 26 and source impedance $Z_O$ 24 match (i.e. they are equal for a resistive impedance, or the complex conjugate if the impedance is complex). Table 30 of FIG. 3a illustrates the voltage and current values for the circuit 30 for when the filter is an open-circuit and a short-circuit (corresponding to the stop-band of the filter) and when the filter is at its characteristic impedance (corresponding to the pass-band). Given that these impedances are complex, the band-pass filter achieves maximum power transfer of the incident signal $e_O$ 20 when the impedance of the filter $Z_L=Z_O^*$, where $Z_O^*$=the complex conjugate of $Z_O$. For the sake of simplicity, the table 30 illustrates the case where $Z_O$ is resistive only (i.e. $Z_O=R_O$). FIG. 3b illustrates the power transfer of the circuit 30 as a function of the resistive impedance of the filter.

FIG. 4a is a conceptual illustration of a filter 42 driven by a source circuit 40 and driving a load circuit 46. FIG. 4b is a conceptual illustration of the transfer characteristic 42c of the filter 42. For most applications, the existence of frequency components in the stop-band of the filter characteristic is not a significant problem. For broadband multichannel systems, however, the presence of significant out-of-band energy can present a real problem as a result of a mismatch in impedance in the stop-band between the filter and either the load or source. The power transfer will be less than optimal due to the mismatch, so out-of-band components having significant energy generated by either the source 40 and load 46 circuits can be reflected back, creating additional distortion in the system. Moreover, if the reflected signals are manifested as increased current or voltage, a source amplifier may clip or otherwise cause non-linear distortion of the signal provided to the filter 42.

FIG. 5 illustrates an application where the impedance presented by a narrow-band filter can be problematic given the drastic difference between the impedance in the pass-band and the stop-band, and the wide frequency range over which the filter must operate. The circuit of FIG. 5 is a structure common to frequency converters such as the one disclosed in the related application entitled "Agile Frequency Converter For Multichannel Systems Using IF-RF Level Exchange For Improved Noise Rejection," filed May 18, 2000 and which is incorporated herein in its entirety by this reference. This related application discloses a frequency converter for use in a broadband system that employs the circuit of FIG. 5. In such frequency converters, a mixer 56 is used in conjunction with a local oscillator signal 57 to convert an IF signal to an RF signal. As described in the in the related application, generation of the IF signal requires that it be filtered through a band-pass filter 58, and that the mixing process can produce additional unwanted distortion signals in the RF output signal. The output of filter 58 is coupled to ports of the mixer. Because the mixer is a passive balanced device, signals are generated at all ports that may contain various components of the input signals. These "leakage" signals that can appear at the output coupled to filter 58 likely will be out-of-band for the filter 58. Thus, if the impedance of filter 58 as seen at the port of mixer 56 is significantly mismatched to the impedance of mixer 56 in the stop-band of filter 58, a significant percentage of the power of the incident out-of-band leakage signals will be reflected back into the mixer and will show up in the RF output signal. It should be noted that for other applications, narrow-band filtering might be required for the other ports of mixer 56 as well, making impedance matching of the filters even more critical.

One technique commonly used in the art to match the impedance of a filter over an entire range of operation is a diplexor circuit that is conceptually illustrated in FIG. 6a. This circuit provides a structure that is the exact complement 62 of the band-pass filter 60, such that the impedance seen by the input signal is the source impedance over the entire frequency range, as illustrated by FIG. 6b. It is extremely difficult if not impossible, however, to build a structure complementary to tuned resonator filter circuits in accordance with the diplexor structure of FIG. 6a. Thus, this solution works for filters that are not resonators, but does not work for resonator circuits that are advantageously used internally to broadband frequency applications.

Several improved narrow-band tuned resonator filter circuits for broadband applications are disclosed in related applications entitled "Magnetically Coupled Resonators For Achieving Low Cost Band-Pass Filters Having High Selectivity, Low Insertion Loss And Improved Out-Of Band Rejection," filed Mar. 16, 1998 having U.S. Ser. No. 09/039,988 and Low Cost, Narrow Band-Pass Tuned Resonator Filter Topologies Having High Selectivity, Low Insertion Loss And Improved Out-Of Band Rejection Over Extended Frequency Ranges, filed Sep. 29, 1999 having U.S. Ser. No. 09/408,826, both of which are incorporated herein in their entirety by this reference.

While there have been some attempts to provide better impedance matching between tuned resonator filters and the devices to which they are coupled, no prior art method or apparatus has been able to provide sufficient matching, particularly at or near the on-frequency of the filter, such that frequencies of IF very close to the frequency of $L_O$ such as in the context of the mixing process of FIG. 5.

Therefore, those of skill in the art will recognize that there is a need for a method and apparatus by which the characteristic impedance of narrow-band resonator filters can be matched to the load or source impedance of the structures to which they are coupled over a broad range of frequencies, particularly for application to broadband multichannel systems.

SUMMARY OF THE INVENTION

It is one objective of the method and apparatus of the present invention to provide impedance matching between tuned resonator filters and the devices to which they are coupled over the frequency range of broadband multichannel systems.

It is further an objective of the present invention to provide sufficient matching to prevent leakage of other input signals such as local oscillator and converted RF signals to be reflected back into a mixer during up-conversion in broadband multichannel systems that can cause degradation in the distortion performance of the system.

In accordance with the present invention, the foregoing and other objectives are achieved by a novel and non-obvious method and apparatus by which the characteristic impedance of a tuned resonator filter can be matched to the impedance of those source and load devices to which it is coupled, and particularly to the ports of a passive mixer.

A first tuned resonator filter is isolated from the port to which it is coupled using a series resonator circuit having a characteristic that is sufficiently a dual of the transfer function of the resonator filter. The series resonator is an open circuit for the stop-band of the tuned resonator filter, and a short circuit in the pass-band of the resonator filter. Thus, to the port, the tuned resonator filter appears as a match to the impedance of its source in the pass-band, and an open-circuit in the stop-band. The port is further coupled to a second tuned resonator filter through an isolation resistor. The second tuned resonator filter is either an exact duplicate of the first tuned resonator filter, or has a similar enough transfer characteristic to the first tuned resonator filter that the impedance seen at the port for frequencies close to the on-frequency of the first filter is not unacceptably degraded.

BRIEF DESCRIPTION OF THE DRAWINGS

A more complete understanding of the method and apparatus of the present invention may be had by reference to the following detailed description when taken in conjunction with the accompanying drawings wherein:

FIG. 7d is a representation of the impedance characteristic of the embodiment of FIG. 7a.

FIG. 9d is a representation of the impedance characteristic of the embodiment of FIG. 9a, illustrating the result of truncating the second resonator of FIG. 9a.

DETAILED DESCRIPTION OF THE INVENTION

As previously discussed it is critical in certain broadband system applications that narrow-band filters present a well-matched impedance to source and/or load over the entire frequency range of the system. One prior art solution to maintaining constant impedance for a filter for non-resonator band-pass filters is to couple a complimentary band-stop filter to the band-pass filter. Creating a complimentary structure for a band-pass resonator filter, however, presents a fundamental problem.

Figure 1A:
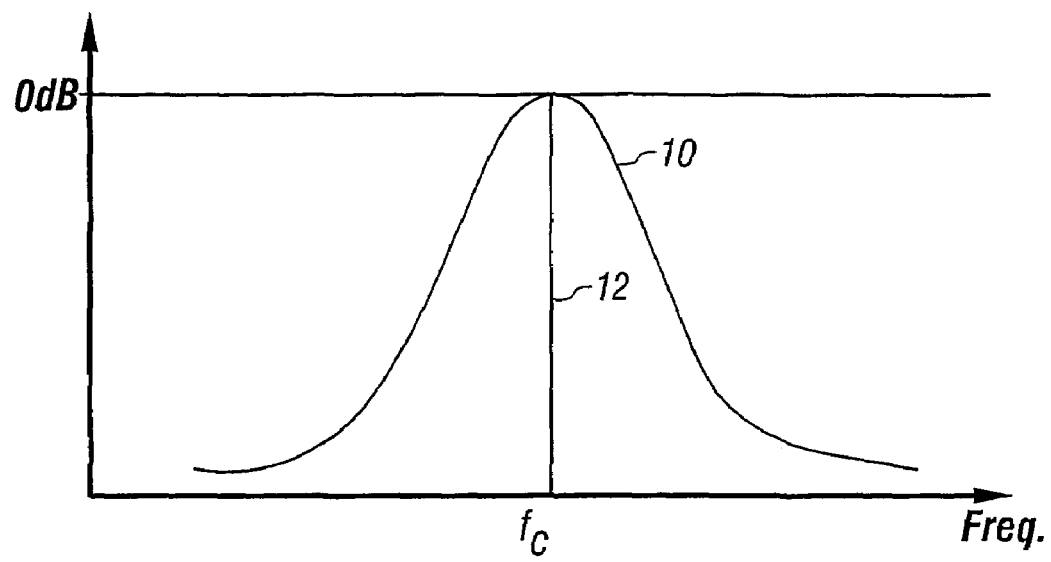
FIG. 1a illustrates an output transfer characteristic of a band-pass filter.
Figure 1B:
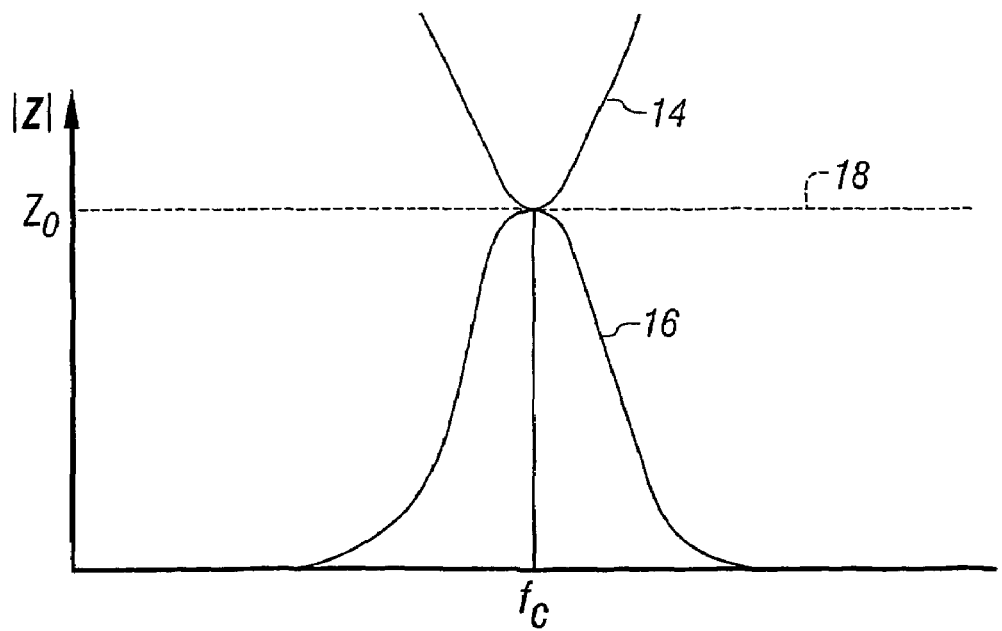
FIG. 1b illustrates the impedance characteristic of a band-pass filter.
Figure 2A:
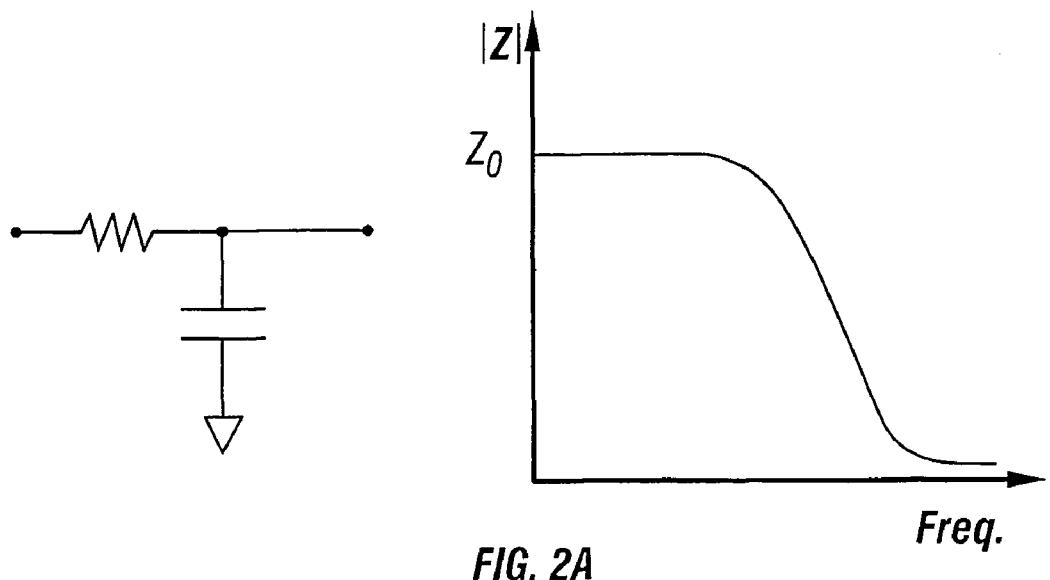
FIG. 2a illustrates the impedance characteristics of a low-pass filter.
Figure 2B:
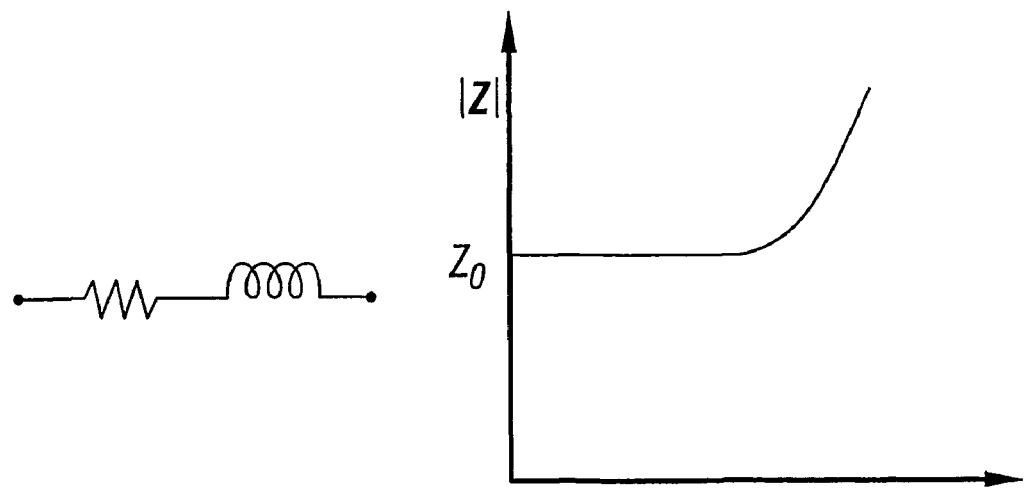
FIG. 2b illustrates the impedance characteristic of a high-pass filter.
Figure 3A:
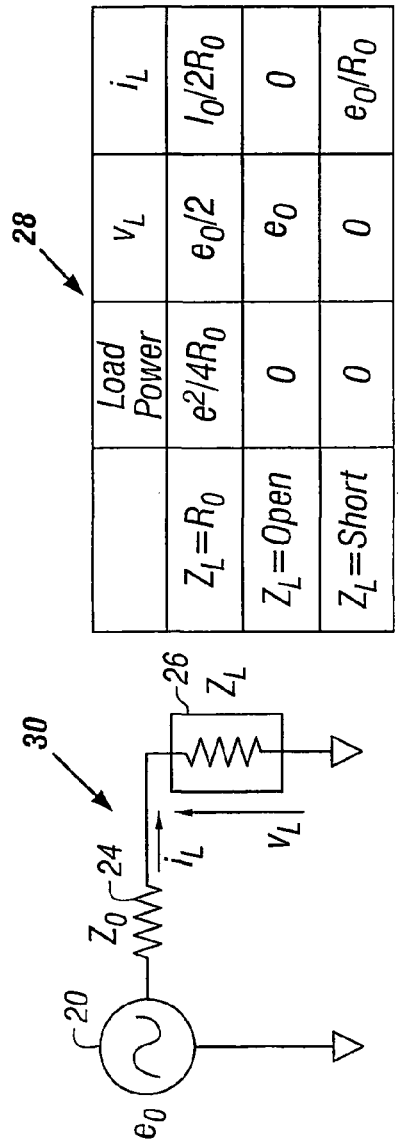
FIG. 3a illustrates power transfer of a signal as a function of the load impedance.
Figure 3B:
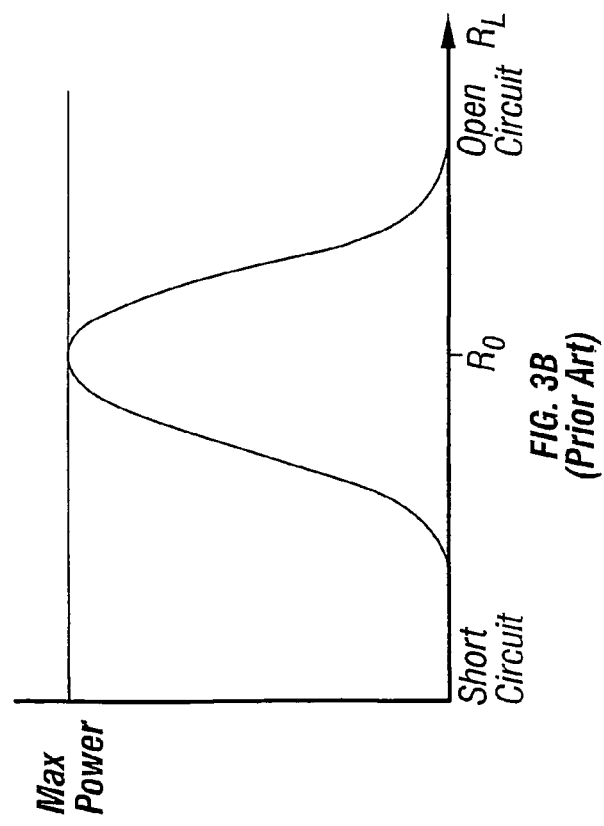
FIG. 3b illustrates the power transfer characteristic of a band-pass filter as a function of its characteristic impedance.
Figure 4A:
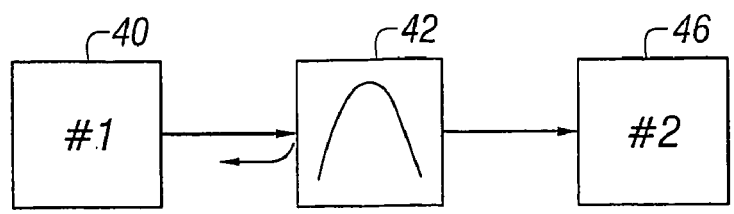
FIG. 4a is a conceptual representation of a band-pass filter with a source circuit driving its input port and a load circuit coupled to its output port.
Figure 4B:
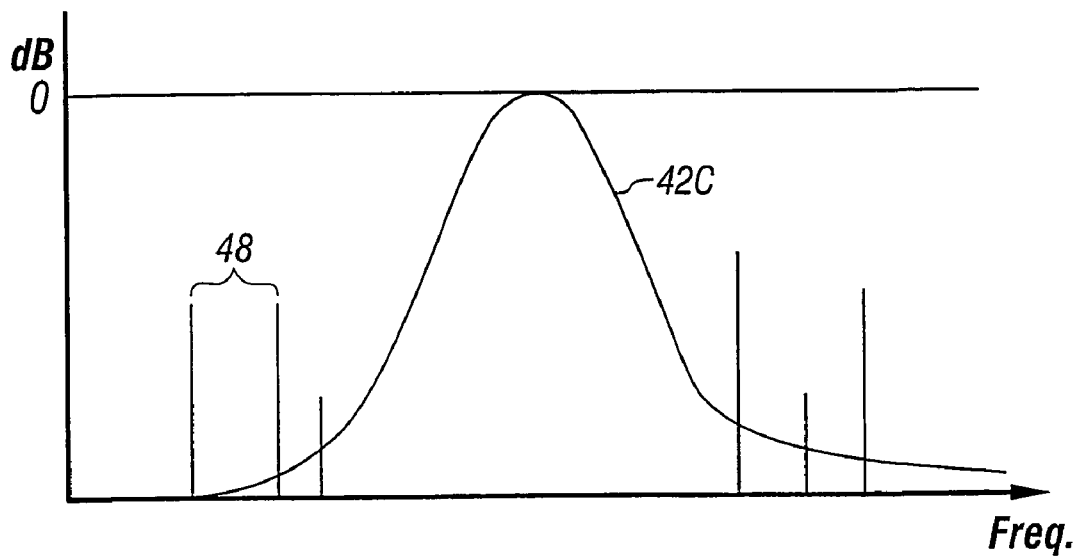
FIG. 4b is a conceptual representation of the output transfer characteristic of a band-pass filter with frequency components in its stop-band.
Figure 5:
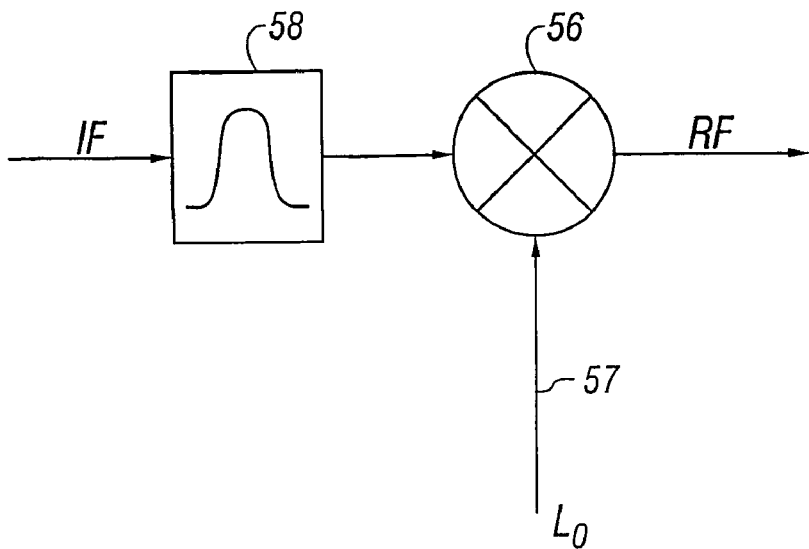
FIG. 5 is a conceptual illustration of an application where narrow-band filters are used in a broadband system during up-conversion of IF signals to RF channel frequencies and where a matched impedance is important to prevent reflection of leakage signals generated by a mixer.
Figure 6A:
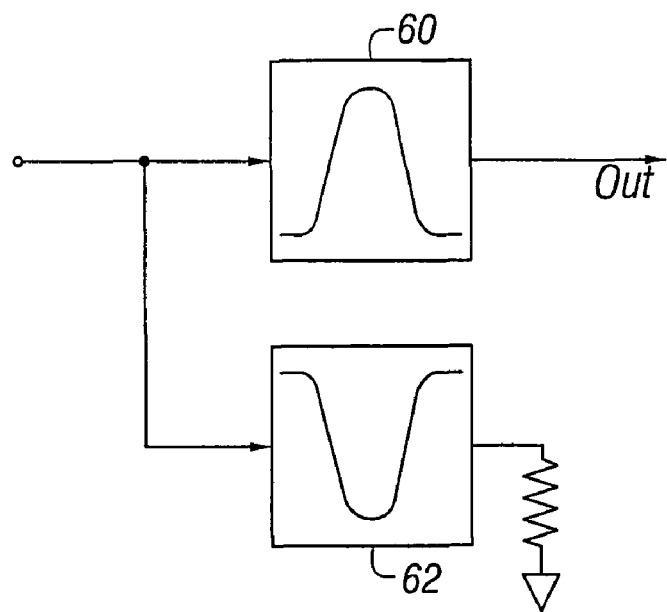
FIG. 6a is a conceptual illustration of a diplexer of the prior art.
Figure 6B:
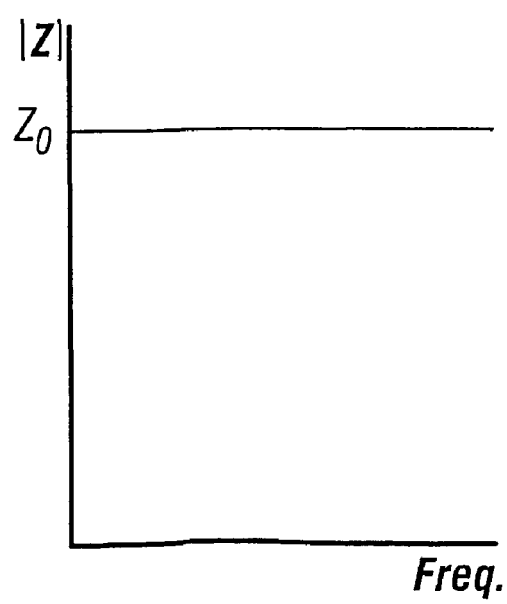
FIG. 6b is a conceptual representation of the impedance seen at the input of the diplexer as a function of frequency.
Figure 7A:
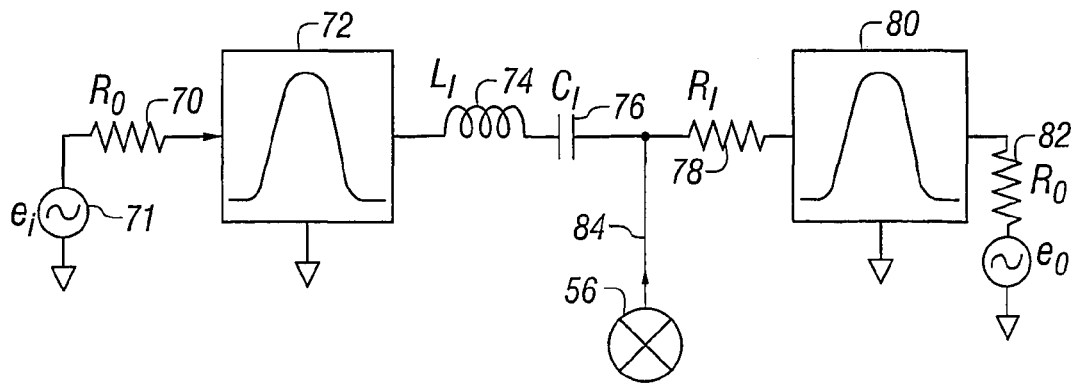
FIG. 7a is one preferred embodiment of the impedance matching circuit of the present invention.

The method and apparatus of the present invention is now described with reference to FIGS. 7a through 9b. FIG. 7a illustrates the concept of the invention from the perspective of the output port 84 of a first band-pass resonator filter 72, which is coupled to a load (typically 50 or 75 ohms), for example, a passive mixer 56. $R_O$ 70 represents a typical impedance of a source providing input voltage $e_i$ 71 (typically 50 or 75 ohms) to which the output impedance of filter 72 is preferably matched. The series resonator formed by $L_1$ 74 and $C_1$ 76 is designed to have a transfer function that is roughly a dual of resonator filter 72 such that the series resonator becomes a short-circuit in the pass-band of resonator filter 72, and an open circuit in the stop-band of filter 72. In one preferred embodiment of the invention, a second band-pass resonator filter 80 is coupled to port 84 (through isolation resistor $R_1$ 78) that is identical to the resonator filter 72 in structure and transfer characteristic. Both resonator filters have a parallel (shunt) structure and are therefore short-circuits in the stop-band, and are "on" and thus couple source and load impedances to their outputs in the pass-band. Resonator 80 is terminated to ground with a load resistor that is equal to $R_O$ 70.

Figure 7B:
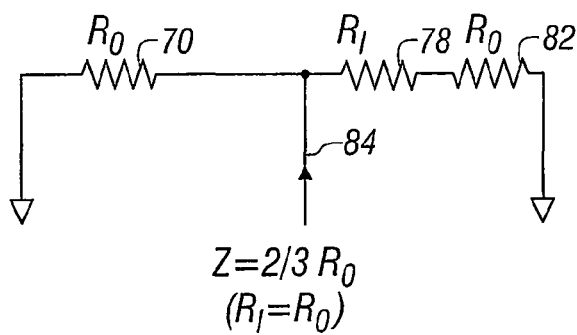
FIG. 7b is an equivalent circuit for the pass-band of the resonator filter the impedance of which is to match the desired impedance.
Figure 7C:
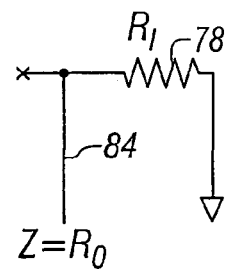
FIG. 7c is an equivalent circuit for the stop-band of the resonator filter the impedance of which is to match the desired impedance.
Figure 7D:
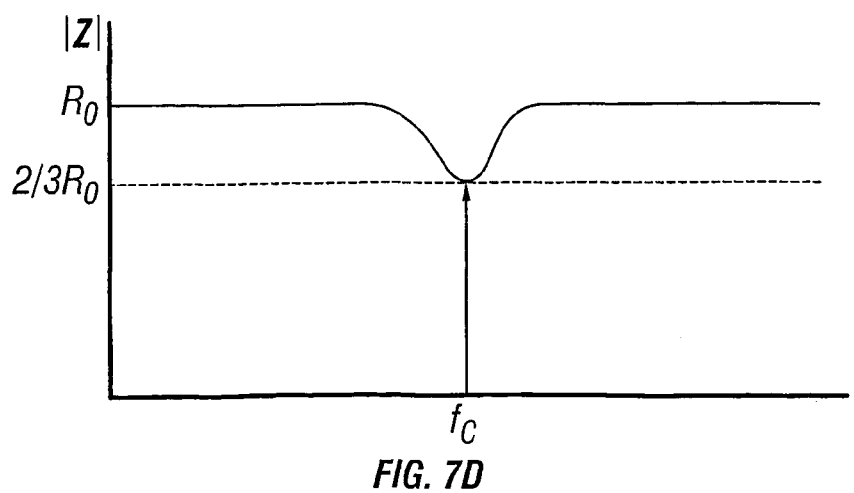

FIG. 7b illustrates the equivalent circuit for frequencies in the pass-band, and FIG. 7c illustrates the equivalent circuit for frequencies in the stop-band of the two resonator filters. If isolation resistor $R_1$ 78 is equal to $R_O$ 70, then the impedance seen at port 84 is $2R_O/3$ in the pass-band, and $R_O$ in the stop-band. The impedance characteristic of the circuit of FIG. 7a is illustrated in FIG. 7d. It can be seen that the impedance is not perfectly matched throughout the entire frequency range, with some insertion loss in the pass-band. Notwithstanding, this a considerable improvement. The insertion loss can be compensated by increasing the value of $R_1$ 78 at the expense of increased impedance in the stop-band.

Figure 8A:
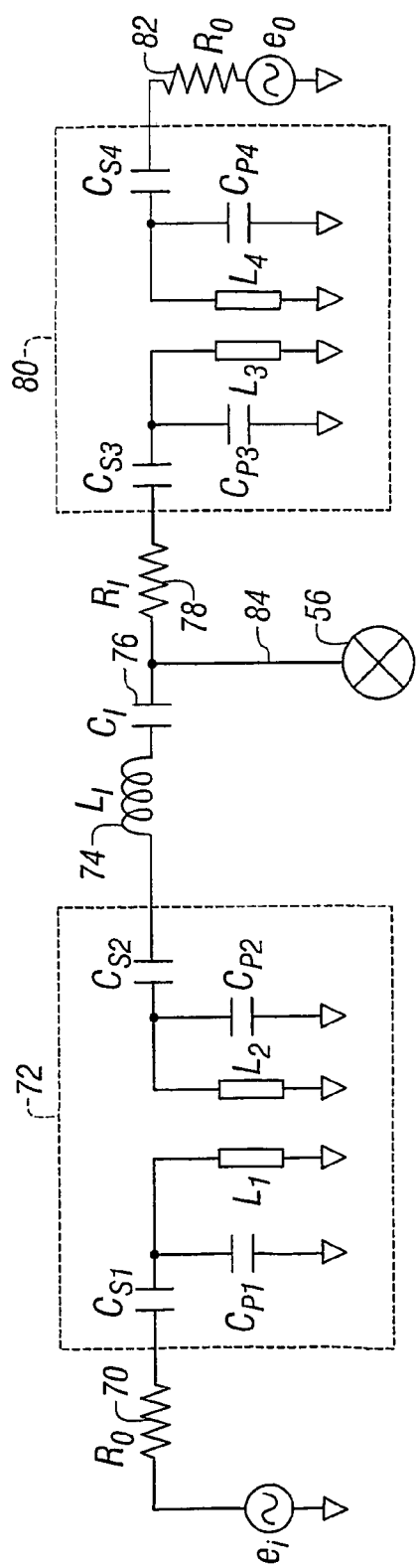
FIG. 8a is a preferred embodiment of the impedance matching circuit of the present invention illustrating one of many resonator filter implementations for which the impedance matching circuit may be employed.
Figure 8B:
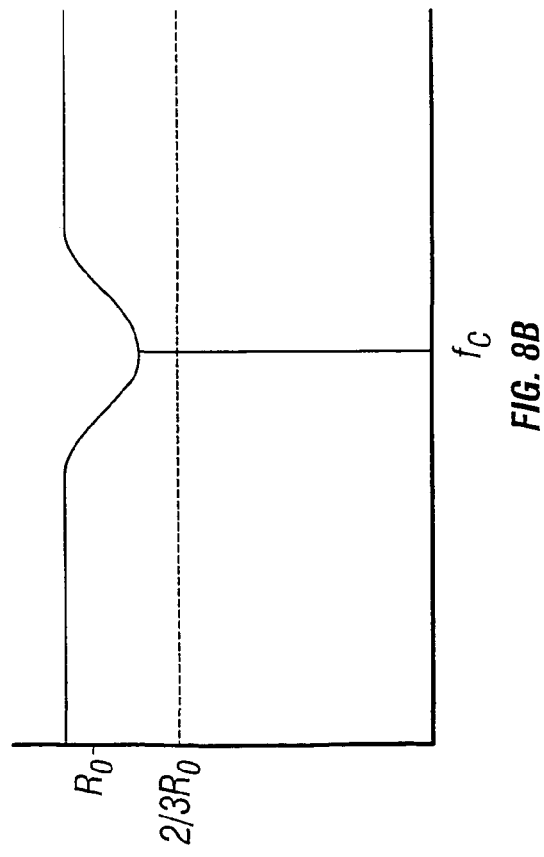
FIG. 8b is a representation of the impedance characteristic of the embodiment of FIG. 8a, illustrating the result of increasing the value of the isolation resistor.

FIG. 8a illustrates an implementation of the present invention using one of the parallel resonator topologies disclosed in the aforementioned '988 and '726 related applications. Mixer 56 is coupled to port 84 for illustration purposes. The impedance characteristic of the circuit illustrated in FIG. 8b contemplates that isolation resistor $R_1$ 78 is chosen to be greater than the value of $R_O$ 70 to compensate for the insertion loss experienced in the pass-band.

Figure 9A:
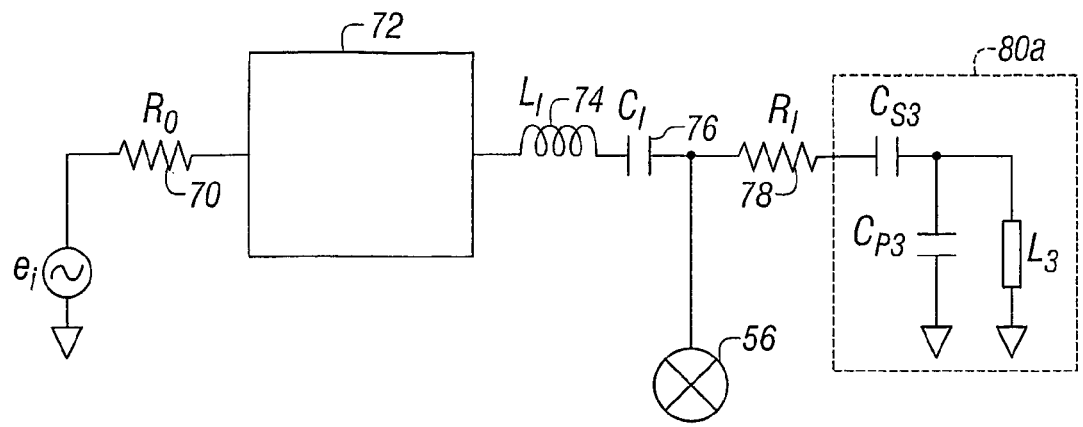
FIG. 9a is a is a preferred embodiment of the impedance matching circuit of the presence invention illustrating how the second resonator may be truncated and simplified if the application can tolerate the resulting degraded impedance matching in the pass-band of the resonator filter.
Figure 9B:
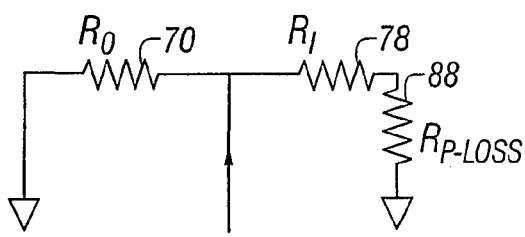
FIG. 9b is an equivalent circuit for the pass-band of the resonator filter of FIG. 9a the impedance of which is to match the desired impedance.
Figure 9C:
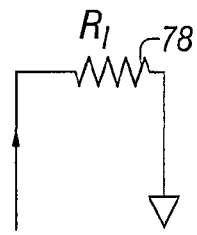
FIG. 9c is an equivalent circuit for the stop-band of the resonator filter of FIG. 9a, the impedance of which is to match the desired impedance.
Figure 9D:
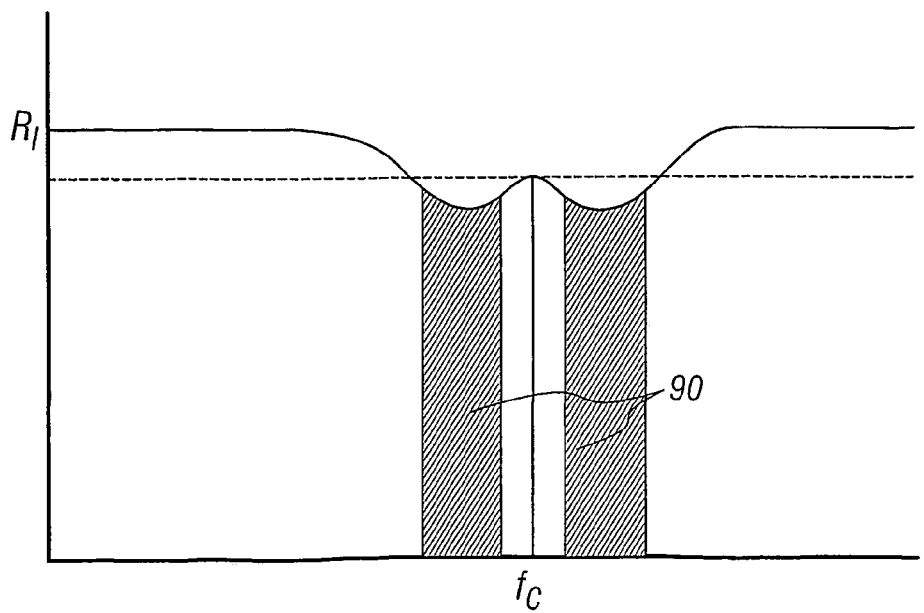

FIG. 9a illustrates an alternate preferred embodiment that is somewhat simpler and can be employed when there is not significant energy in the frequencies around the on-frequency of the resonator filter 72. The resonator filter 72 is the same as in FIG. 8a, but the resonator 80a in FIG. 9a has been truncated to only one resonator, rather than two in parallel as in the resonator 80 of FIG. 8a. Although the characteristic of the resonator 80a in FIG. 9a will no longer be as sharp as that of resonator filter 72, it is good enough provided the resulting relaxed matching does not create problems for signals in the frequency for which matching has been degraded. FIGS. 9b and 9c illustrate the equivalent circuits for the circuit of FIG. 9a in the pass-band and stop-band respectively of the resonator filter 72. The difference between the circuits of FIGS. 8a and 9a is that 80a is no longer terminated, and is replaced by a resistance $R_{P\text{-}loss}$ 88 that represents the resistive loss while resonator 80a is resonating. Provided there are no significant components falling within the frequency ranges 90, the degraded impedance matching occurring as a result of the simplification in resonator 80a.

The embodiments disclosed herein are for illustrative purposes, and those of skill in the art will recognize that other applications requiring matched filter impedance over a wide range of frequency and other topologies of tuned resonator filters may be used in substitution for those disclosed herein without departing from the intended scope of the invention.

What is claimed is:

1. An apparatus for substantially matching the impedance of a resonator filter to a desired impedance at a port, said apparatus comprising:
    a first resonator filter having an input coupled to a signal and further having an output transfer characteristic;
    a second resonator having an output characteristic substantially the same as said first resonator;
    an isolation resonator coupled between said first resonator and said port;
    an isolation resistor coupled between said second resonator and said port;
    wherein said isolation resonator has an impedance characteristic that is complementary to said first resonator filter.

2. The apparatus of claim 1 wherein said second resonator is identical to said first resonator filter.

3. The apparatus of claim 1 wherein said first resonator is a double-tuned parallel resonator.

4. The apparatus of claim 1 wherein the second resonator is a truncation of said first resonator filter.

* * * * *